(12) United States Patent
Hsiao et al.

(10) Patent No.: US 9,960,134 B2
(45) Date of Patent: May 1, 2018

(54) SEMICONDUCTOR DEVICE AND BUMP FORMATION PROCESS

(71) Applicant: Taiwan Semiconductor Manufacturing Company, Ltd., Hsin-Chu (TW)

(72) Inventors: Yi-Li Hsiao, Hsin-Chu (TW);
Chen-Hua Yu, Hsin-Chu (TW);
Shin-Puu Jeng, Hsin-Chu (TW);
Chih-Hang Tung, Hsin-Chu (TW);
Cheng-Chang Wei, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 32 days.

(21) Appl. No.: 15/269,212

(22) Filed: Sep. 19, 2016

(65) Prior Publication Data

US 2017/0005051 A1    Jan. 5, 2017

Related U.S. Application Data

(62) Division of application No. 13/787,670, filed on Mar. 6, 2013, now Pat. No. 9,455,183, which is a division
(Continued)

(51) Int. Cl.
*H01L 23/00* (2006.01)
*H01L 21/768* (2006.01)
(Continued)

(52) U.S. Cl.
CPC .............. *H01L 24/11* (2013.01); *H01L 21/44* (2013.01); *H01L 21/76885* (2013.01); *H01L 23/49811* (2013.01); *H01L 23/52* (2013.01); *H01L 24/05* (2013.01); *H01L 24/13* (2013.01);

*H01L 24/03* (2013.01); *H01L 2224/0347* (2013.01); *H01L 2224/0361* (2013.01); *H01L 2224/03912* (2013.01); *H01L 2224/10126* (2013.01);
(Continued)

(58) Field of Classification Search
CPC ............................... H01L 21/563; H01L 24/11
See application file for complete search history.

(56) References Cited

U.S. PATENT DOCUMENTS 5,130,779 A    7/1992   Agarwala et al.
5,834,366 A   11/1998   Akram
(Continued)

FOREIGN PATENT DOCUMENTS

JP   2007188943 A   7/2007
TW       523871 B   3/2003

OTHER PUBLICATIONS

Kloeser, J., et al., "High-performance flip chip packages with copper pillar bumping," Global SMT & Packaging, May 2006, pp. 28-31.
(Continued)

*Primary Examiner* — Eugene Lee
(74) *Attorney, Agent, or Firm* — Slater Matsil, LLP

(57) ABSTRACT

A semiconductor device includes a solder bump overlying and electrically connected to a pad region, and a metal cap layer formed on at least a portion of the solder bump. The metal cap layer has a melting temperature greater than the melting temperature of the solder bump.

20 Claims, 10 Drawing Sheets

Related U.S. Application Data of application No. 12/883,950, filed on Sep. 16, 2010, now abandoned.

(60) Provisional application No. 61/301,456, filed on Feb. 4, 2010.

(51) Int. Cl.
*H01L 23/498* (2006.01)
*H01L 21/44* (2006.01)
*H01L 23/52* (2006.01)

(52) U.S. Cl.
CPC . *H01L 2224/10145* (2013.01); *H01L 2224/11* (2013.01); *H01L 2224/1147* (2013.01); *H01L 2224/11823* (2013.01); *H01L 2224/11825* (2013.01); *H01L 2224/13018* (2013.01); *H01L 2224/13562* (2013.01); *H01L 2224/13565* (2013.01); *H01L 2224/80815* (2013.01); *H01L 2224/81815* (2013.01); *H01L 2924/01322* (2013.01); *H01L 2924/1305* (2013.01); *H01L 2924/1306* (2013.01); *H01L 2924/13091* (2013.01); *H01L 2924/14* (2013.01)

(56) References Cited

U.S. PATENT DOCUMENTS

| | | |
|---|---|---|
| 6,127,731 A | 10/2000 | Hoffmeyer |
| 6,225,206 B1 | 5/2001 | Jimarez et al. |
| 6,300,164 B1 | 10/2001 | Call et al. |
| 6,471,115 B1 | 10/2002 | Ijuin et al. |
| 6,495,397 B2 * | 12/2002 | Kubota ............ H01L 24/11 228/180.21 |
| 6,712,260 B1 | 3/2004 | Kuo et al. |
| 6,727,586 B2 | 4/2004 | Frankowsky et al. |
| 2001/0013423 A1 | 8/2001 | Dalal et al. |
| 2003/0006062 A1 | 1/2003 | Stone et al. |
| 2003/0151140 A1 | 8/2003 | Nishiyama et al. |
| 2007/0075410 A1 * | 4/2007 | Chan ............ H01L 21/563 257/678 |
| 2007/0166993 A1 | 7/2007 | Lee et al. |
| 2007/0167004 A1 | 7/2007 | Trezza |
| 2008/0227237 A1 | 9/2008 | Lin et al. |
| 2010/0109159 A1 | 5/2010 | Ho et al. |

OTHER PUBLICATIONS

Korhonen, T-M., et al., "Interconnections Based on Bi-Coated SnAg Solder Balls"; IEEE Transactions on Advanced Packaging, vol. 24, No. 4, Nov. 2001, pp. 515-520.

* cited by examiner

SEMICONDUCTOR DEVICE AND BUMP FORMATION PROCESS

PRIORITY CLAIM AND CROSS-REFERENCE

This application is a divisional of U.S. patent application Ser. No. 13/787,670 filed on 6 Mar. 2013, entitled "Semiconductor Device And Bump Formation Process," which is a divisional of U.S. patent application Ser. No. 12/883,950 filed on 16 Sep. 2010, entitled "Semiconductor Device and Bump Formation Process," which application further claims the benefit of U.S. Provisional Application No. 61/301,456 filed on 4 Feb. 2010, entitled "Fine Pitch Solder Bumps and Process For Making Same," which applications are hereby incorporated herein by reference.

TECHNICAL FIELD

This disclosure relates to semiconductor devices, and more particularly, to the fabrication of bump structures in semiconductor devices.

BACKGROUND

Modern integrated circuits are made up of literally millions of active and/or passive devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. In a typical bumping process, interconnect structures are formed on metallization layers, followed by the formation of under-bump metallurgy (UBM) and solder balls. Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in that order, on the I/O pad. The bumps themselves, based on the material used, are classified as solder bumps, gold bumps, copper pillar bumps and bumps with mixed metals.

Usually, a material used for the solder alloy is so-called Sn—Pb eutectic solder of Sn-38 mass % Pb. Recently the semiconductor industry has been moving to "lead (Pb) free" packaging and lead-free device connector technology. This trend increasingly results in the use of lead free solder bumps and lead free solder balls to form connections with integrated circuits and packages. The use of lead free solder is safer for the environment, safer for workers in the industry and safer for consumers than lead based solder bumps or solder balls. However, the quality and reliability of the solder bumps has not always been as great as desired. For finer pitches and larger interconnect densities, the risk of shorts occurring between solder bumps during fabrication and flip-chip assembly is high.

DETAILED DESCRIPTION

This disclosure provides bump formation processes used in semiconductor devices applied to flip-chip assembly, wafer-level chip scale package (WLCSP), three-dimensional integrated circuit (3D-IC) stack, and/or any advanced package technology fields. Embodiments described herein relate to methods of forming solder bumps for use with semiconductor devices. In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1A-1G are cross-sectional views of a portion of a semiconductor device at various stages in a bump formation process in accordance with an exemplary embodiment.

Figure 1A:
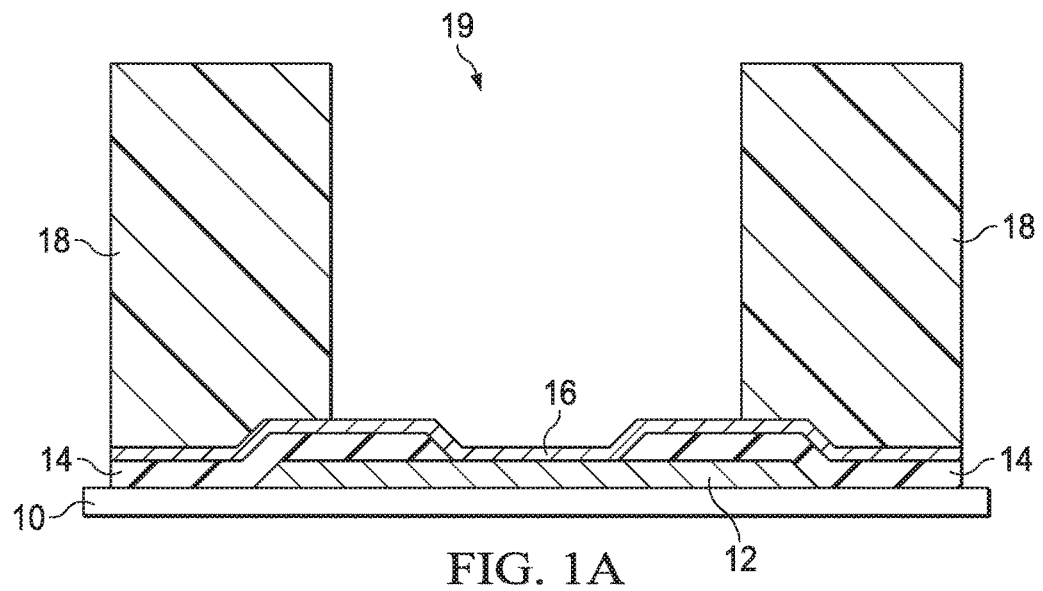
FIGS. 1A-1G are cross-sectional views of a portion of a semiconductor device at various stages in a bump formation process in accordance with an embodiment.

With reference to FIG. 1A, an exemplary semiconductor substrate 10 used for bump fabrication is employed in a semiconductor device fabrication, and integrated circuits may be formed therein and/or thereupon. The semiconductor substrate 10 is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), resistors, diodes, capacitors, inductors, fuses, or other suitable elements. Various processes are performed to form the various microelectronic elements including deposition, etching, implantation, photolithography, annealing, or other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers.

FIG. 1A depicts a conductive region 12 and a passivation layer 14 formed on the substrate 10. The conductive region 12 is a metallization layer formed over the inter-layer dielectric layers. The conductive region 12 is a portion of conductive routes and has an exposed surface treated by a planarization process, such as chemical mechanical polishing (CMP), if necessary. Suitable materials for the conductive region 12 may include, but are not limited to, for example copper, aluminum, copper alloy, or other mobile conductive materials, although it may also be formed of, or include, other materials such as copper, silver, gold, nickel, tungsten, alloys thereof, and/or multi-layers thereof. In one embodiment, the conductive region 12 is a pad region 12, which may be used in the bonding process to connect the integrated circuits in the respective chip to external features. The passivation layer 14 is formed on the substrate 10, overlying the pad region 12. Using photolithography and etching processes, the passivation layer 14 is patterned to form an opening exposing a portion of the conductive region 12. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used.

FIG. 1A also depicts the formation of an under-bump-metallurgy (UBM) layer 16 on the passivation layer 14, electrically connected to the pad region 12. The UBM layer 16 is formed on the passivation layer 14 and the exposed portion of the conductive region 12. In an embodiment, the UBM layer 16 includes a diffusion barrier layer and/or a seed layer. The diffusion barrier layer, also referred to as a glue layer, is formed to cover the sidewalls and the bottom of the opening of the passivation layer 14. The diffusion barrier layer may be formed of titanium, although it may also be formed of other materials such as titanium nitride, tantalum, tantalum nitride, or the like. The formation methods include physical vapor deposition (PVD) or sputtering. The seed layer may be a copper seed layer formed on the diffusion barrier layer using PVD or sputtering. The seed layer may be formed of copper alloys that include silver, chromium, nickel, tin, gold, or combinations thereof. In one embodiment, the UBM layer 16 is a Cu/Ti layer. The diffusion barrier layer may have a thickness about 1000-2000 Angstroms, and the seed layer may have a thickness equal to about 3000-7000 Angstroms, although their thicknesses may also be greater or smaller. The dimensions recited throughout the description are merely examples, and will be scaled with the downscaling of integrated circuits.

FIG. 1A further depicts the formation a mask layer 18 provided on the UBM layer 16 and patterned with an opening 19 for example, by exposure, development or etching, so that a portion of the UBM layer 16 is exposed for bump formation. The mask layer 18 may be a dry film or a photoresist film. In an embodiment, the mask layer 18 is a dry film, and may be formed of an organic material such as Ajinimoto buildup film (ABF). In alternative embodiments, the mask layer 18 is formed of a photo resist. The thickness of the mask layer 18 may be greater than about 5 µm, or even between about 10 µm and about 120 µm.

Figure 1B:
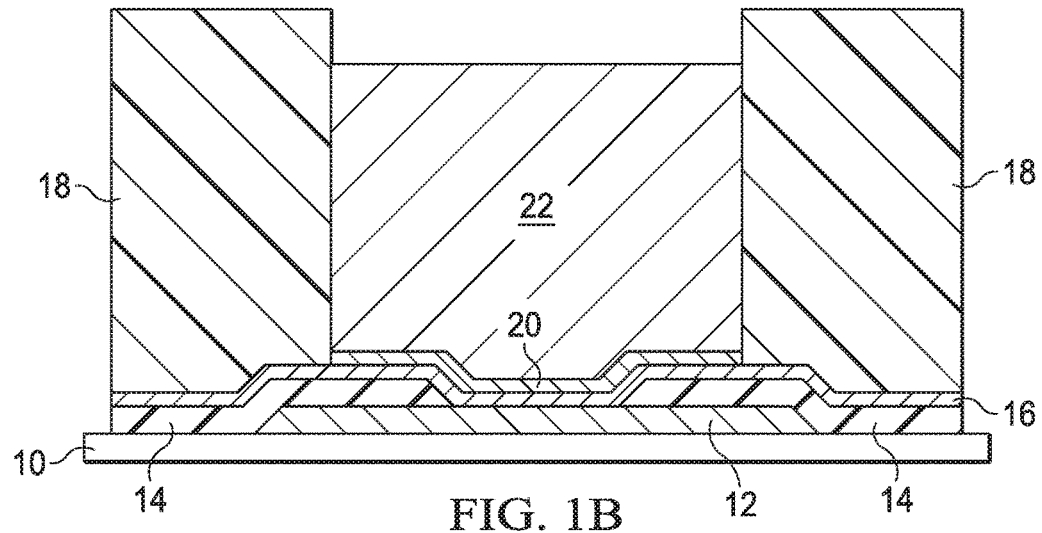

Referring to FIG. 1B, a solder material layer 22 is formed over the UBM layer 16 within the opening 19 of the mask layer 18. The solder material layer 22 is made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. In one embodiment, the solder material layer 22 is a lead-free solder material layer. In some embodiments, an optional metallization layer 20 is deposited in the opening 19 before the formation of the solder material layer 22. The optional metallization layer 20 has a thickness less than 10 um. In some embodiments, the optional metallization layer 20 has a thickness about 1-10 µm, for example about 4-8 µm, although the thickness may be greater or smaller. The formation method of the metallization layer 20 may include electro plating methods. In one embodiment, the optional metallization layer 20 includes a copper layer, a copper alloy layer, a nickel layer, a nickel alloy layer, or combinations thereof. In some embodiments, the optional metallization layer 20 includes gold (Au), silver, palladium (Pd), indium (In), nickel-palladium-gold (NiPdAu), nickel-gold (NiAu) or other similar materials or alloy.

Figure 1C:
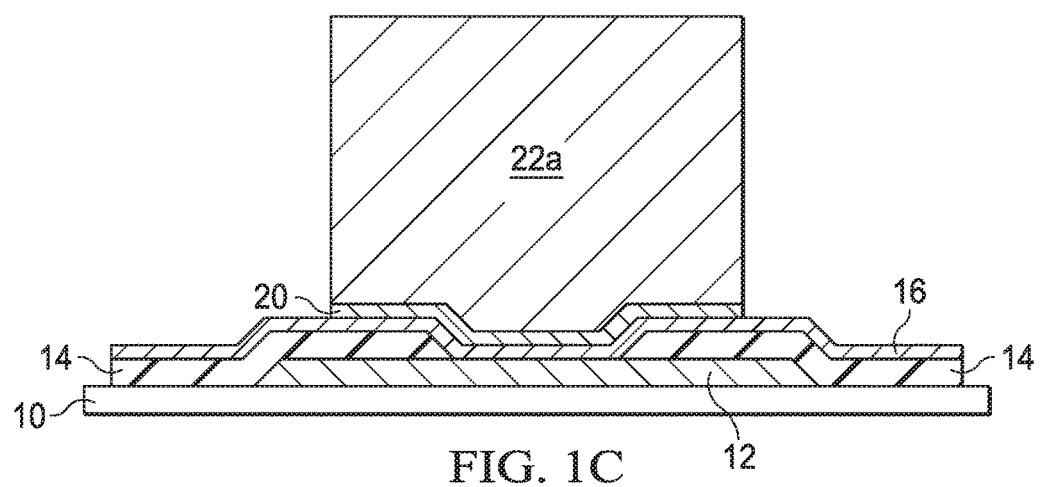
Figure 1D:
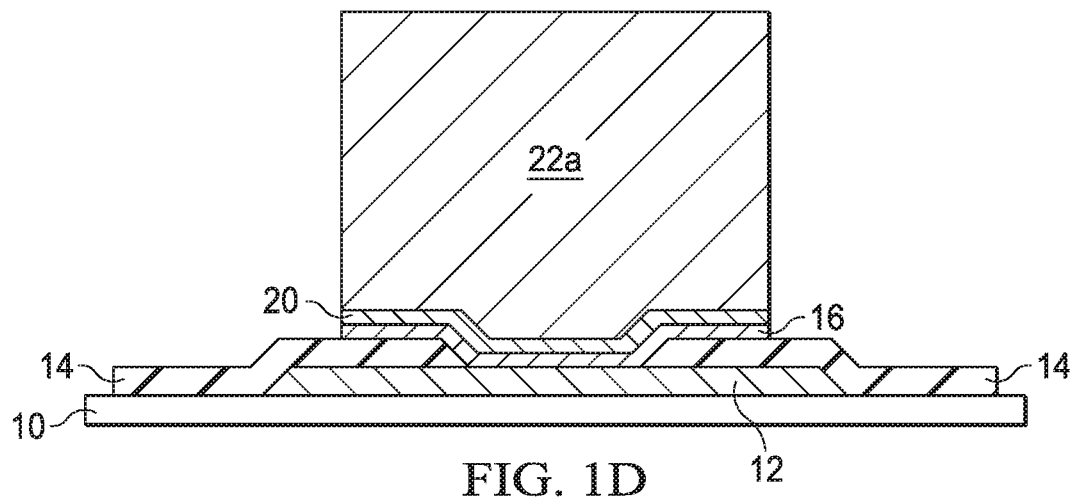

Next, the mask layer 18 is removed as shown in FIG. 1C. In the case the mask layer 18 is a dry film, it may be removed using an alkaline solution. If the mask layer 18 is formed of photoresist, it may be removed by a wet stripping process using acetone, n-methyl pyrrolidone (NMP), dimethyl sulfoxide (DMSO), aminoethoxy ethanol, and the like. Thus, the uncovered portions of the UBM layer 16 are exposed, and the solder material layer 22 becomes a solder pillar 22a. In an embodiment, the thickness of the solder pillar 22a is greater than 40 um. In other embodiments, the thickness of the solder pillar 22a is about 40-70 µm, although the thickness may be greater or smaller. Next, as shown in FIG. 1D, uncovered portions of the UBM layer 16 are removed to expose the underlying passivation layer 14 by etching methods, such as wet etching, dry etching or the like.

Figure 1E:
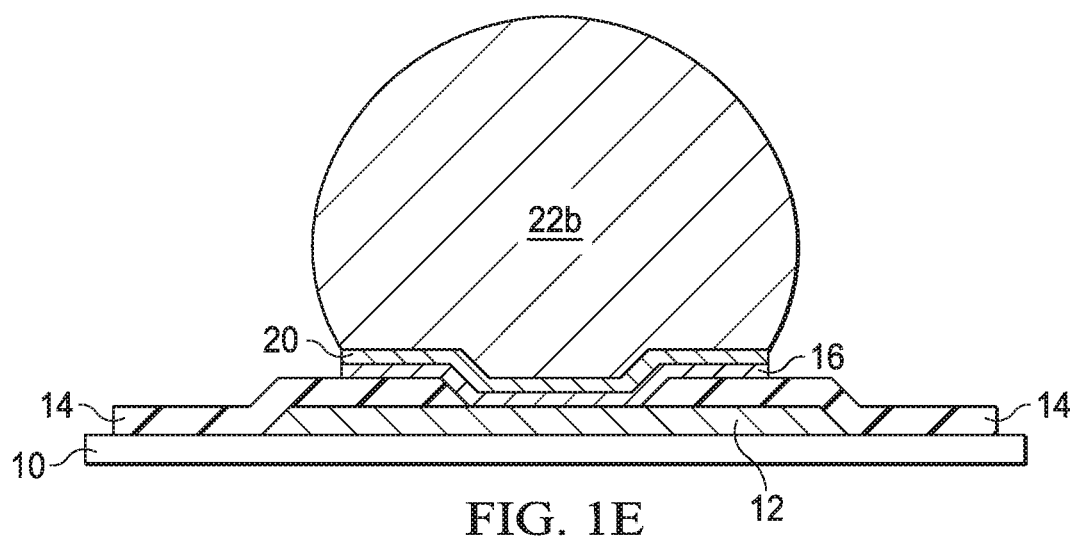

FIG. 1E depicts a thermal reflow process performed on the solder pillar 22a, forming a ball-shaped solder bump 22b. During thermal cycling, an intermetallic compound (IMC) layer may be formed between the solder bump 22b and the optional metallization layer 20. The optional metallization layer 20 may be consumed during the IMC formation.

Figure 1F:
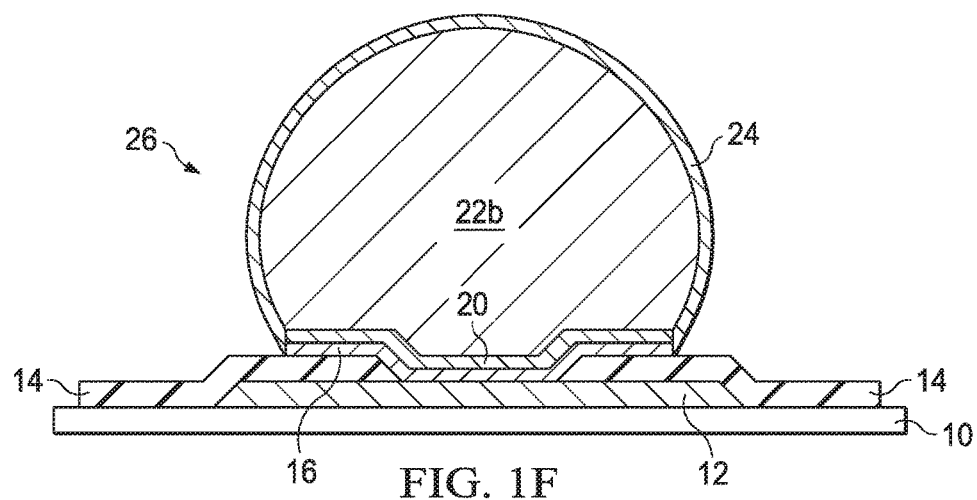

With reference to FIG. 1F, a metal cap layer 24 is formed on at least an exposed portion of the solder bump 22b. In one embodiment, the metal cap layer 24 is formed on the entire surface of the solder bump 22b. In other embodiments, the metal cap layer 24 extends to cover the surface of the optional metallization layer 20 and the UBM layer 16. The metal cap layer 24 is a metal material layer with a melting temperature greater than the melting temperature of the solder material layer 22. In some embodiments, the metal cap layer 24 is formed of copper, nickel (Ni), gold (Au), silver (Ag), palladium (Pd), indium (In), nickel-palladium-gold (NiPdAu), nickel-gold (NiAu), other similar materials, or alloy. In some embodiments, the metal cap layer 24 may further include many other conductive materials used in semiconductor packaging such as indium (In), platinum (Pt), cobalt (Co), vanadium (V), and their alloys. In one embodiment, the metal cap layer 24 has a thickness about 0.02 µm-5 µm, although the thickness may be greater or smaller. The metal cap layer 24 may be a single-layered structure or a multi-layered structure. In an embodiment, the metal cap layer 24 is deposited by electroless or immersion metal deposition process, for example an ENEPIG structure (a stack of an electroless nickel (Ni)/electroless palladium (Pd)/immersion gold (Au) layers), an ENEP structure (a stack of an electroless nickel (Ni)/electroless palladium (Pd) layers), and EN layer (an electroless nickel (Ni) layer), an ENIG structure (a stack of an electroless nickel (Ni)/immersion gold (Au) layers), or combinations thereof.

This completes a bump structure 26 including the UBM layer 16, the optional metallization layer 20, the solder bump 22b and the metal cap layer 24. The bump structure 26 of the embodiments may be various sizes in diameter and may include so-called "micro-bumps". For example, the bump structure may be 65-80 microns in diameter. The pitch between bump structures may be less than 150 microns, such as 130-140 microns, and may in the future get even smaller. For micro-bump applications, the pitch may be 20-50 microns, and the diameter may be between 10-25 microns as well. The resulting bump structure 26 has a portion that is covered with the metal cap layer 24 that is harder, and has a higher melting point, than the solder bump 22b. The metal cap layer 24 causes the solder bump 22b to act as a spring or act like an air filled balloon when subsequently pushed against a substrate, that is, the bump structure 26 can resist deformation. In some ways, the metal cap layer 24 acts as a hard stop. The bump structure 26 can maintain a more uniform stand off height in completed packages, and the shorting and bridging problems are reduced or eliminated.

Figure 1G:
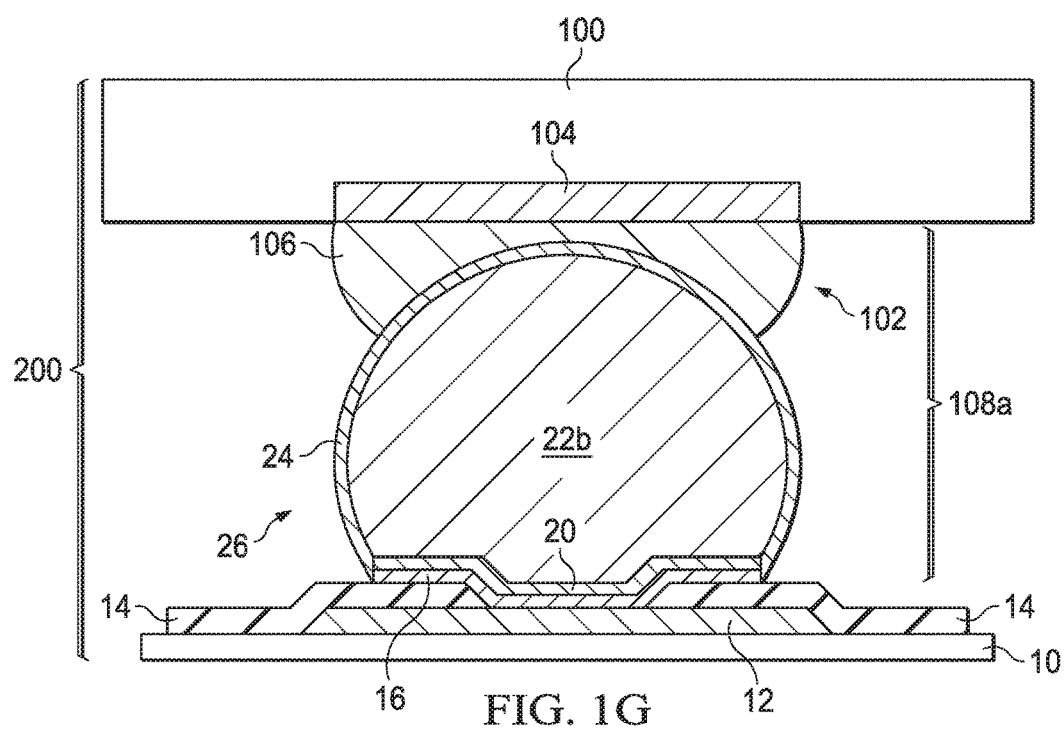

FIG. 1G is a cross-sectional diagram depicting an embodiment of a package assembly with the bump structure 26. After the formation of the bump structure 26, the substrate 10 may then be sawed and packaged onto a package substrate, or another die, with solder balls or Cu posts mounted on a pad on the package substrate or the other die. The structure shown in FIG. 1F is attached to another substrate 100. The substrate 100 may be a package substrate, board (e.g., a print circuit board (PCB)), or other suitable substrate. The connection structure 102 contacts the substrate 100 at various conductive attachment points, for example, a solder layer 106 on contact pads 104 and/or conductive traces. The solder layer 106 may be a eutectic solder material including alloys of tin, lead, silver, copper, nickel, bismuth, or combinations thereof. Using an exemplary coupling process including a flux application, chip placement, thermally reflowing of melting solder joints, and cleaning of flux residue, a joint-solder structure 108 is formed between the substrates 10 and 100. The substrate 10, the joint-solder layer 108a, and the other substrate 100 is referred to as a packaging assembly 200, or in the present embodiment, a flip-chip assembly. In some embodiments, after thermal cycles during package assembly process, the metal cap layer 24 may react with the solder bump 22b and/or the solder layer 106, resulting in an intermetallic compound (IMC) within the joint-solder structure 108a. Also, the metal elements in the metal cap layer 24 may diffuse into the solder bump 22b and/or the solder layer 106 after thermal cycles. The metal cap layer 24 may be partially consumed during the IMC formation. It is discovered that the use of the metal cap layer 24 on the solder bump 22b maintains a more uniform stand off height in completed packages, and improved reliability of the semiconductor device.

Figure 2A:
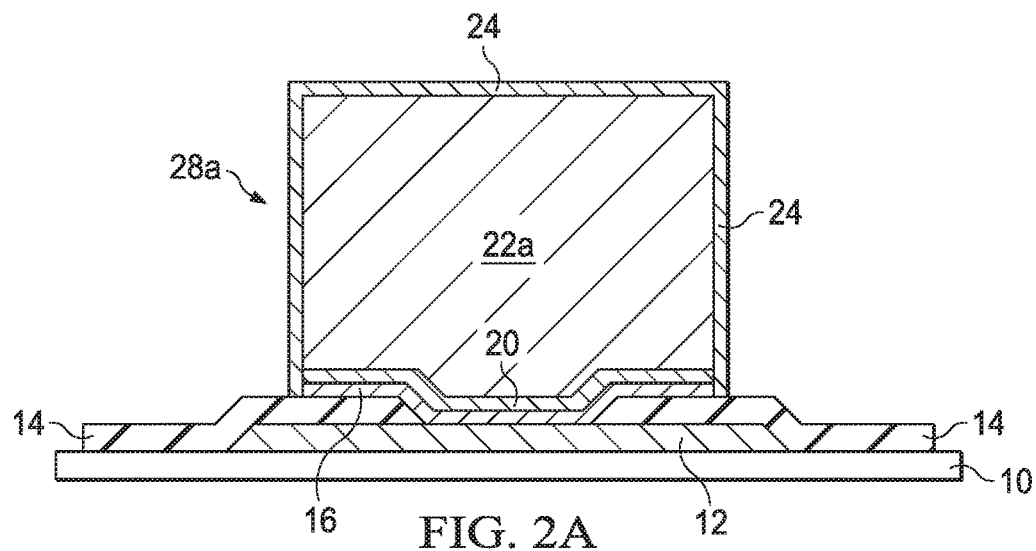
FIGS. 2A-2C are cross-sectional views of a portion of a semiconductor device at various stages in a bump formation process in accordance with an embodiment.
Figure 2B:
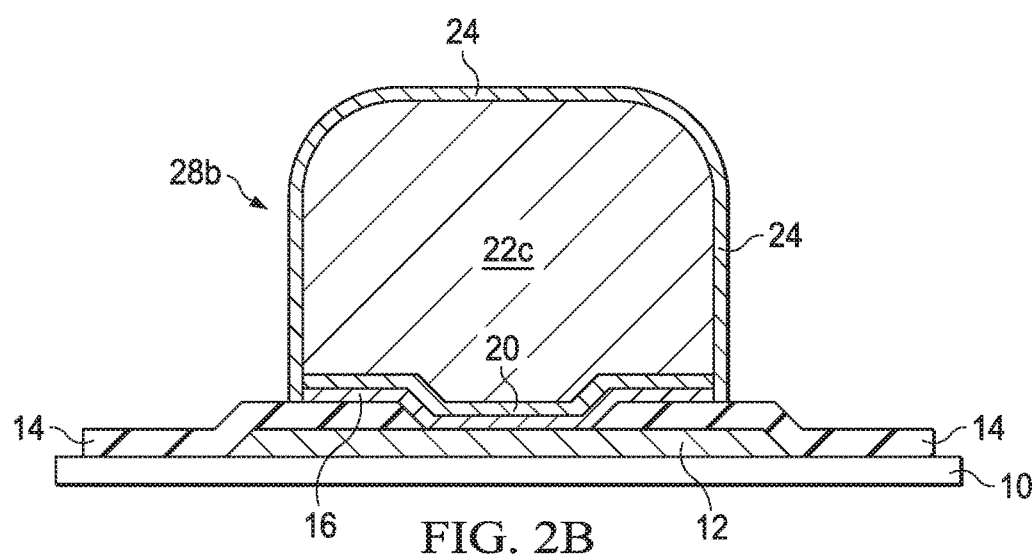
Figure 2C:
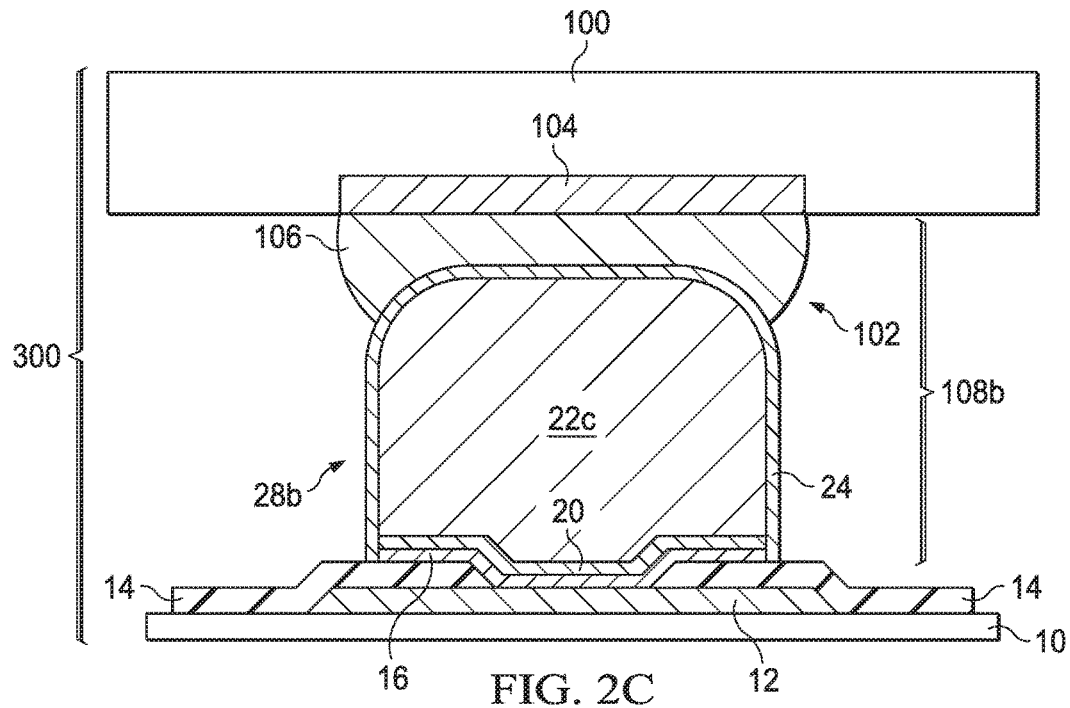

FIGS. 2A-2C are cross-sectional views of a portion of a semiconductor device at various stages in a bump formation process in accordance with embodiments. The explanation of the same or similar portions to the description in FIG. 1A to FIG. 1G will be omitted.

With reference to FIG. 2A, after the UBM etching process, the resulting structure as shown in FIG. 1D proceeds to the formation of the metal cap layer 24. That is, the metal cap layer 24 is formed on the solder pillar 22a before performing a solder thermal reflow process. In one embodiment, the metal cap layer 24 is formed on the entire surface of the solder pillar 22a by electroless or immersion metal deposition process. In some embodiments, the metal cap layer 24 extends to cover a portion of the optional metallization layer 20 and the UBM layer 16. This completes a bump structure 28a including the UBM layer 16, the optional metallization layer 20, the solder pillar 22a and the metal cap layer 24. The metal cap layer 24 causes the solder pillar 22a to act as a spring or act like an air filled balloon when subsequently pushed against a substrate. The metal cap layer 24 acts as a hard stop to make the bump structure 28a maintain a more uniform stand off height in completed packages. The shorting and bridging problems are therefore reduced or eliminated.

In an alternative embodiment, the bump structure 28a proceeds to a solder thermal reflow process. With reference to FIG. 2B, the solder pillar 22a is thermally reflowed to shape the pillar into a rounded solder bump 22C. In one embodiment, the solder bump 22C includes a rounded corner in a cross-sectional view. Also, the metal elements in the metal cap layer 24 may diffuse into the solder bump 22C after thermal cycles. This completes another bump structure 28b including the UBM layer 16, the optional metallization layer 20, the rounded solder bump 22C and the metal cap layer 24. The metal cap layer 24 causes the solder bump 22C to act as a spring or act like an air filled balloon when subsequently pushed against a substrate. The metal cap layer 24 acts as a hard stop to make the bump structure 28b maintain a more uniform stand off height in completed packages. The shorting and bridging problems are therefore reduced or eliminated.

FIG. 2C is a cross-sectional diagram depicting an embodiment of a package assembly with the bump structure 28b. After the formation of the bump structure 28a or 28b, the substrate 10 may then be sawed and packaged to another substrate 100 through the connection structure 102 including a solder layer 106 on contact pads 104 and/or conductive traces. Using an exemplary coupling process, a joint-solder structure 108b is formed between the substrates 10 and 100. The substrate 10, the joint-solder layer 108b, and the other substrate 100 is referred to as a packaging assembly 300. In the case of forming the bump structure 28a on the substrate 10, the solder pillar 22a is thermally reflowed to shape the pillar into a rounded solder bump 22C during the coupling process, and thereby the bump structure 28 becomes the bump structure 28b in the packaging assembly 300. Also, the metal elements in the metal cap layer 24 may diffuse into the solder bump 22C and/or the solder layer 106 after thermal cycles. It is discovered that the use of the metal cap layer 24 of the bump structure 28a or 28b maintains a more uniform stand off height in completed packages, and improved reliability of the semiconductor device.

FIGS. 3A-3D are cross-sectional views of a portion of a semiconductor device at various stages in a bump formation process in accordance with an embodiment. The explanation of the same or similar portions to the description in FIG. 1A to FIG. 1G will be omitted.

Figure 3A:
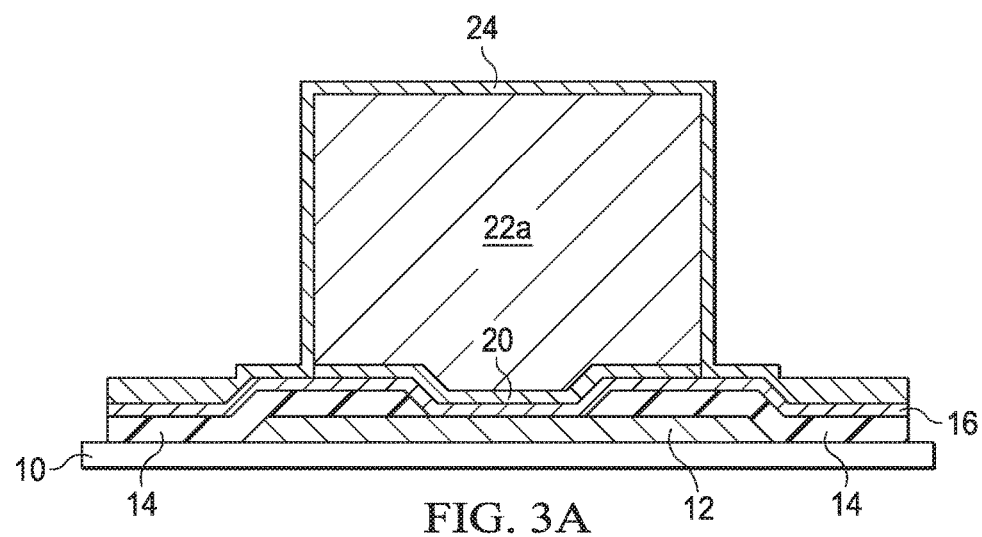
FIGS. 3A-3D are cross-sectional views of a portion of a semiconductor device at various stages in a bump formation process in accordance with an embodiment.

With reference to FIG. 3A, after removing the mask layer, the resulting structure as shown in FIG. 1C proceeds to the formation of the metal cap layer 24. That is, the metal cap layer 24 is formed on the solder pillar 22a and the uncovered portions of the UBM layer 16 before performing an UBM etching process. In one embodiment, the metal cap layer 24 is formed on the entire surface of the solder pillar 22a by electro plating, electroless plating, or chemical vapor deposition (CVD) methods.

Figure 3B:
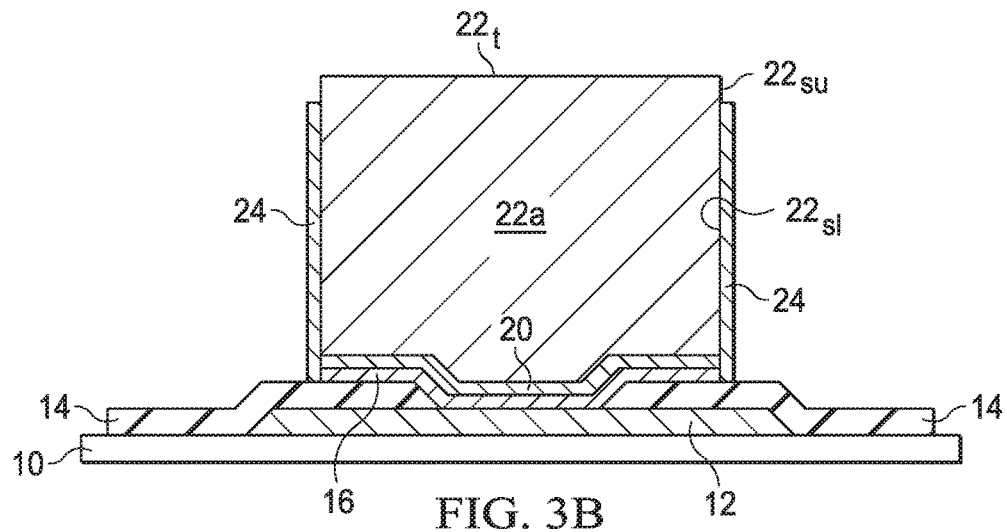

Next, as shown in FIG. 3B, an etching process, such as wet etching, dry etching or the like, is performed in order to remove the UBM layer 16 outside the solder pillar 22a till the passivation layer 14 is exposed. The metal cap layer 24 and the UBM layer 16 outside the solder pillar 22a are removed in the etching process, and a portion of the metal cap layer 24 on the surface of the solder pillar 22a is also removed. In one embodiment, a portion of the metal cap layer 24 on the top of the solder pillar 22a is removed to expose the top surface 22t of the solder pillar 22a. In some embodiments, a portion of the metal cap layer 24 adjacent to the upper sidewall of the solder pillar 22a is removed to expose the upper sidewall surface 22su of the solder pillar 22a. The metal cap layer 24 remains on the lower sidewall surface $22s_L$ of the solder pillar 22a.

Figure 3C:
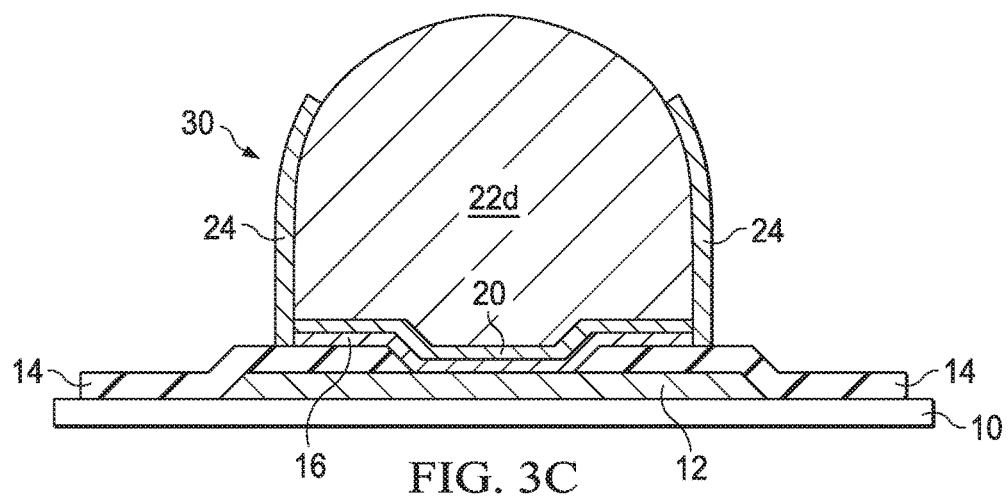

FIG. 3C depicts a thermal reflow process performed on the solder pillar 22a, forming a surface-rounded solder bump 22d. During thermal cycling, the metal elements of the metal cap layer 24 may diffuse into the solder bump 22d, and an intermetallic compound (IMC) layer may be formed between the solder bump 22d and the metal cap layer 24. This completes a bump structure 30 including the UBM layer 16, the optional metallization layer 20, the solder bump 22d and the metal cap layer 24. The metal cap layer 24 remains on the lower sidewall surface $22s_L$ of the solder bump 22d. The metal cap layer 24 causes the solder bump 22d to act as a spring or act like an air filled balloon when subsequently pushed against a substrate. The metal cap layer 24 acts as a hard stop to make the bump structure 28a maintain a more uniform stand off height in completed packages. The shorting and bridging problems are therefore reduced or eliminated.

Figure 3D:
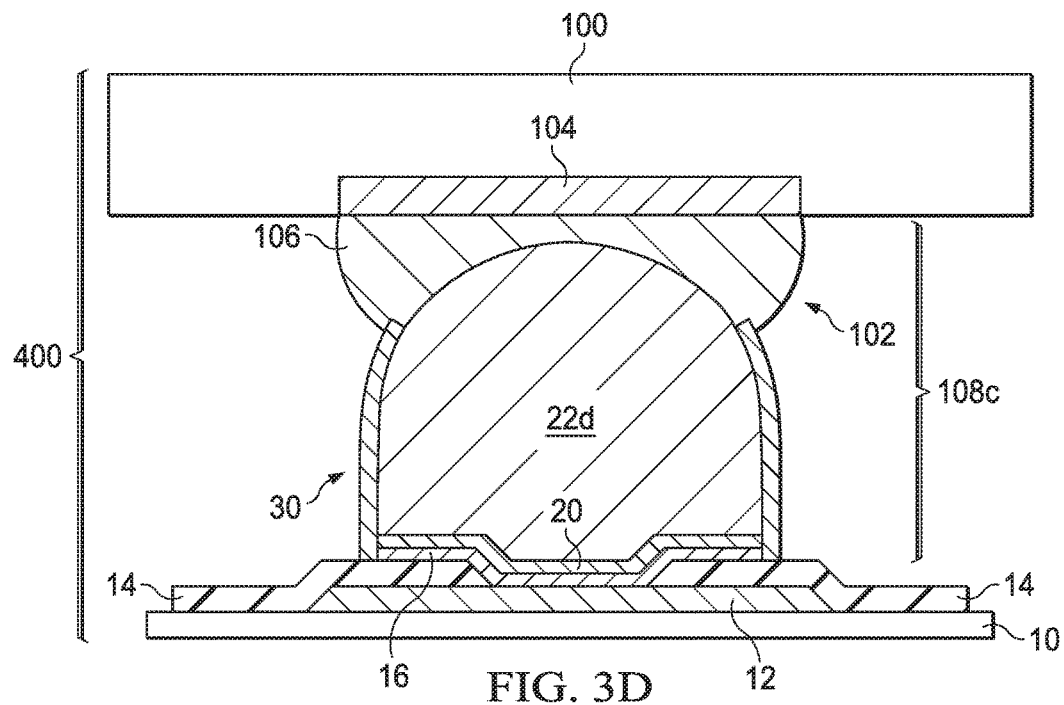

FIG. 3D is a cross-sectional diagram depicting an embodiment of a package assembly with the bump structure 30. After the formation of the bump structure 30, the substrate 10 may then be sawed and packaged to another substrate 100 through the connection structure 102 including a solder layer 106 on contact pads 104 and/or conductive traces. Using an exemplary coupling process, a joint-solder structure 108c is formed between the substrates 10 and 100. The substrate 10, the joint-solder layer 108c, and the other substrate 100 is referred to as a packaging assembly 400. It is discovered that the use of the metal cap layer 24 of the bump structure 30 maintains a more uniform stand off height in completed packages, and improved reliability of the semiconductor device.

FIGS. 4A-4E are cross-sectional views of a portion of a semiconductor device at various stages in a bump formation process in accordance with an embodiment. The explanation of the same or similar portions to the description in FIG. 1A to FIG. 1G will be omitted.

Figure 4A:
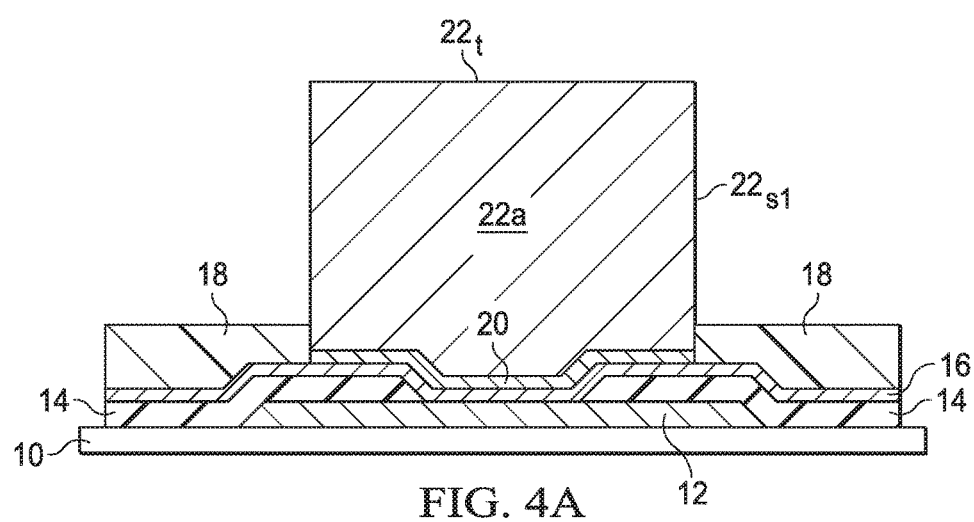
FIGS. 4A-4E are cross-sectional views of a portion of a semiconductor device at various stages in a bump formation process in accordance with an embodiment.

With reference to FIG. 4A, after the formation of the solder material layer 22 in the opening 18 of the mask layer 18, the mask layer 18 is partially removed to expose a portion of the solder pillar 22a, and a portion of the mask layer 18 remains at the lower portions of the solder pillar 22a. In one embodiment, the top surface 22t is exposed, and an upper portion of the sidewall surface $22s_1$ is exposed. For example, more than 50% (e.g., about 70%-80%) of the sidewall surface is exposed at this step.

Figure 4B:
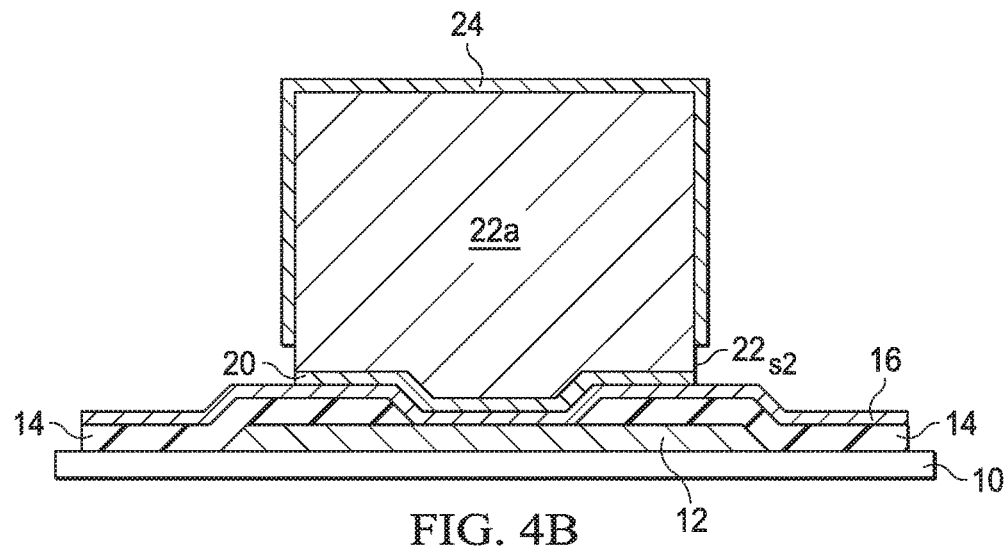

Next, as shown in FIG. 4B, a metal cap layer 24 is formed on the exposed surface of the solder pillar 22a by electro plating or electroless plating methods, followed by removing the remaining portion of the mask layer 18. That is, the metal cap layer 24 is formed on the uncovered surface of the solder pillar 22a, including the top surface 22t and the upper portion of the sidewall surface $22s_1$. After completely removing the mask layer 18, the lower portion of the sidewall surface $22s_2$ and the UBM layer 16 are exposed.

Figure 4C:
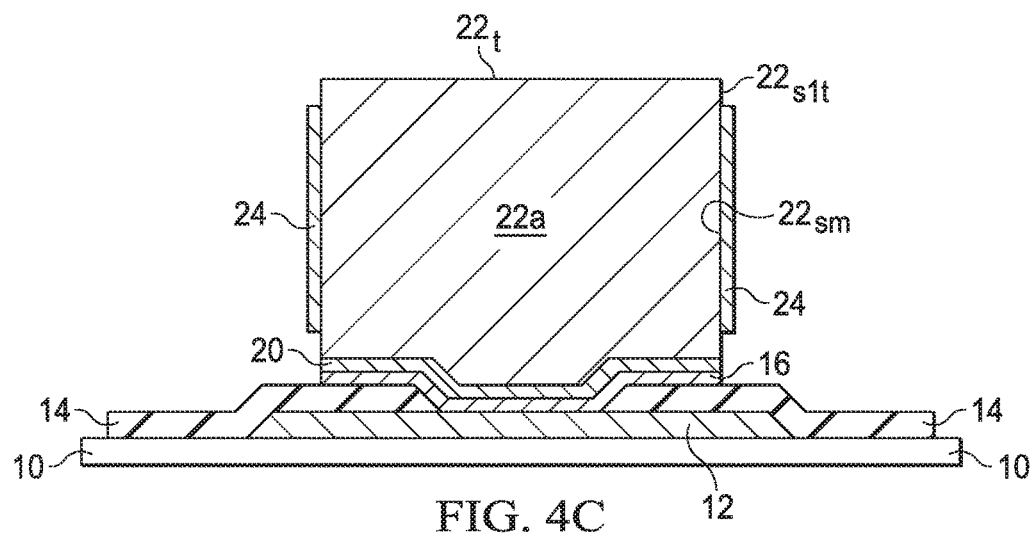

Next, as shown in FIG. 4C, an etching process, such as wet etching, dry etching or the like, is performed in order to remove the UBM layer 16 outside the solder pillar 22a till the passivation layer 14 is exposed. A portion of the metal cap layer 24 on the surface of the solder pillar 22a is also removed during the UBM etching step. In one embodiment, a portion of the metal cap layer 24 on the top of the solder pillar 22a is removed to expose the top surface 22t. In some embodiments, a portion of the metal cap layer 24 on to the top of the upper portion sidewall of the solder pillar 22a is removed to expose the top sidewall surface $22s_{1t}$. The metal cap layer 24 remains on the middle sidewall surface 22sm of the solder pillar 22a.

Figure 4D:
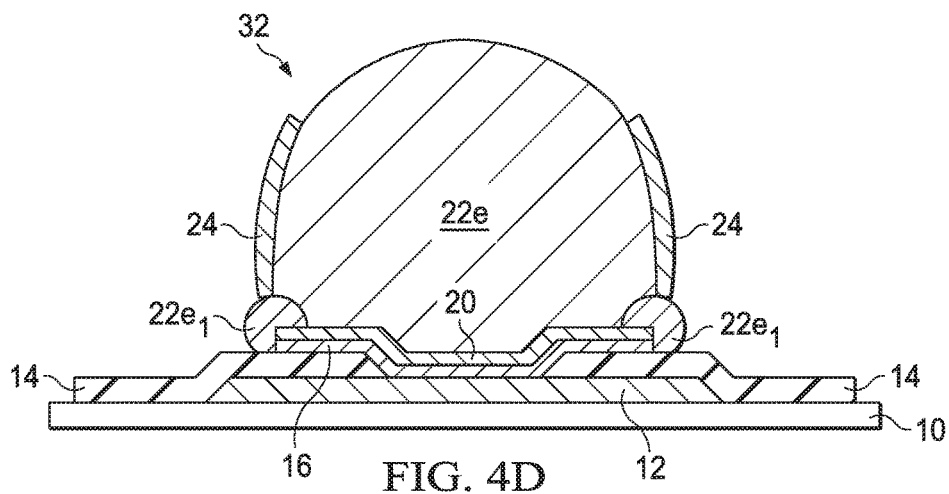

FIG. 4D depicts a thermal reflow process performed on the solder pillar 22a, forming an ovoid-shaped solder bump 22e. Because the metal cap layer 24 has a higher melting point than the solder material, the bump shape is laterally spread at the bottom portion $22e_1$ that is outside the metal cap layer 24. The bottom portion $22e_1$ provides several advantages, e.g., providing an additional stress relief feature, further promoting adhesion of the solder bump with the underlying materials, as well as providing a mechanical stress relief. During thermal cycling, the metal elements of the metal cap layer 24 may diffuse into the solder bump 22e, and an intermetallic compound (IMC) layer may be formed between the solder bump 22e and the metal cap layer 24.

This completes a bump structure 32 including the UBM layer 16, the optional metallization layer 20, the solder bump 22e and the metal cap layer 24. The metal cap layer 24 causes the solder bump 22e to act as a spring or act like an air filled balloon when subsequently pushed against a substrate. The metal cap layer 24 acts as a hard stop to make the bump structure 28a maintain a more uniform stand off height in completed packages. The shorting and bridging problems are therefore reduced or eliminated.

Figure 4E:
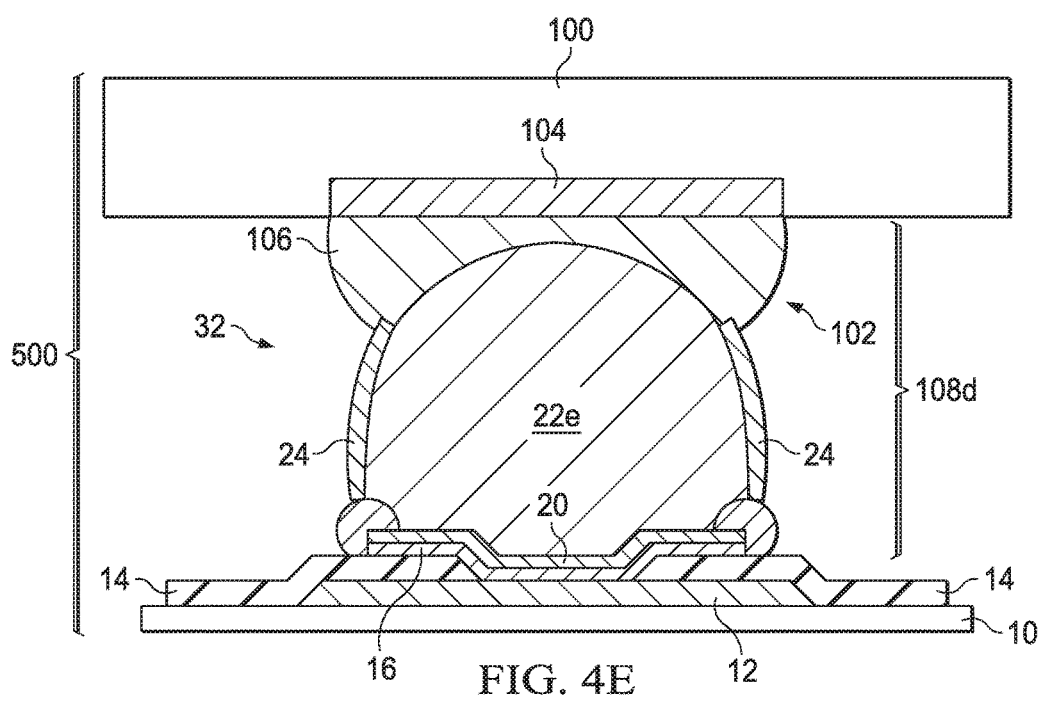

FIG. 4E is a cross-sectional diagram depicting an embodiment of a package assembly with the bump structure 32. After the formation of the bump structure 32, the substrate 10 may then be sawed and packaged to another substrate 100 through the connection structure 102 including a solder layer 106 on contact pads 104 and/or conductive traces. Using an exemplary coupling process, a joint-solder structure 108d is formed between the substrates 10 and 100. The substrate 10, the joint-solder layer 108d, and the other substrate 100 is referred to as a packaging assembly 500. It is discovered that the use of the metal cap layer 24 of the bump structure 32 maintains a more uniform stand off height in completed packages, and improved reliability of the semiconductor device.

A representative method of forming a packaging assembly includes a step of disposing a bump structure between a semiconductor substrate and a package substrate, where the bump structure electrically connects the semiconductor substrate to the package substrate. The bump structure comprises a solder bump. A metal cap layer covers at least a portion of the solder bump, while a top portion of the solder bump remains exposed. The metal cap layer has a melting temperature greater than a melting temperature of the solder bump. The metal cap layer may comprise at least one of nickel, palladium, and gold. The metal cap layer may comprise copper. The solder bump may comprise a lead-free solder material. The method may further comprise a step of forming the metal cap layer on a middle sidewall surface of the solder bump. The method may further comprise a step of forming the metal cap layer on a lower sidewall surface of the solder bump and covering a bottom portion of the solder bump.

Another representative method of forming a semiconductor device includes a step of forming a solder material layer over a semiconductor substrate. The solder material layer comprises a substantially homogenous material. A metal cap layer is conformally formed over the solder material layer. A portion of the metal cap layer is removed to expose at least a top portion of the solder material layer, while a remaining portion of the metal cap layer covers at least a portion of the solder material layer. A thermal reflow of the solder material layer is performed, wherein the metal cap layer has a melting temperature that is greater than a melting temperature of the solder material layer. Removal of a portion of the metal cap layer may further comprise removing another portion of the metal cap layer to expose a bottom portion of the solder material layer. Forming the solder material layer over the semiconductor substrate may further comprise forming a pillar on the semiconductor substrate. The thermal reflow may comprise formation of a solder bump on the semiconductor substrate. Forming the solder material layer may further comprise forming a lead free solder layer.

Yet another representative method of forming a semiconductor device includes steps of forming a pad region on a semiconductor substrate, and connecting a solder bump to the pad region. A metal cap layer is formed over at least a portion of the solder bump, wherein the metal cap layer has a first melting temperature greater than a second melting temperature of the solder bump. A top portion of the solder bump is exposed. The method may further comprise a step of reflowing the solder bump. The metal cap layer may comprise nickel. The metal cap layer may comprise palladium or gold. The metal cap layer may comprise copper. The solder bump may comprise a lead-free solder material. The metal cap layer may be formed on a middle sidewall surface of the solder bump. The solder bump may have a bottom portion disposed outside lateral extents of the metal cap layer. The metal cap layer may be formed on a lower sidewall surface of the solder bump, with the metal cap layer extending to a bottom portion of the solder bump.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of concepts as expressed herein.

What is claimed is:

1. A method of forming a semiconductor device, the method comprising:
   forming a pad region on a semiconductor substrate;
   connecting a solder bump to the pad region;
   forming a metal cap layer on a middle sidewall surface of the solder bump, wherein the metal cap layer has a first melting temperature greater than a second melting temperature of the solder bump, wherein connecting the solder bump to the pad region comprises the solder bump having a bottom portion disposed outside lateral extents of the metal cap layer; and
   exposing a top portion of the solder bump.

2. The method of claim 1, further comprising reflowing the solder bump.

3. The method of claim 1, wherein forming the metal cap layer comprises the metal cap layer comprising nickel.

4. The method of claim 1, wherein forming the metal cap layer comprises the metal cap layer comprising palladium or gold.

5. The method of claim 1, wherein forming the metal cap layer comprises the metal cap layer comprising copper.

6. The method of claim 1, wherein connecting the solder bump to the pad region comprises the solder bump comprising a lead-free solder material.

7. A method comprising:
   forming a conductive pillar over a first conductive pad of a first substrate;
   forming a metal cap layer over a top surface and over upper sidewalls of the conductive pillar, wherein the metal cap layer has a higher melting temperature than the conductive pillar;
   removing portions of the metal cap layer to expose the top surface of the conductive pillar;
   reshaping the conductive pillar after removing portions of the metal cap layer; and
   after reshaping the conductive pillar, attaching the top surface of the conductive pillar to a second conductive pad of a second substrate.

8. The method of claim 7, wherein the conductive pillar is formed of a solder material.

9. The method of claim 7, wherein the metal cap layer is formed of a material harder than a material of the conductive pillar.

10. The method of claim 7, wherein the metal cap layer is formed of a material selected from the group consisting of copper, nickel, gold, silver, palladium, indium, and alloy thereof.

11. The method of claim 7, wherein removing portions of the metal cap layer further comprises removing portions of the metal cap layer along sidewalls of the conductive pillar and proximate the top surface of the conductive pillar.

12. The method of claim 7, wherein the conductive pillar has a first shape before reshaping the conductive pillar and has a second shape different from the first shape after reshaping the conductive pillar.

13. The method of claim 12, wherein the first shape of the conductive pillar has straight sidewalls, and the second shape of the conductive pillar has curved sidewalls.

14. The method of claim 7, wherein reshaping the conductive pillar comprises performing a first reflow process.

15. The method of claim 14, wherein attaching the top surface of the conductive pillar to the second conductive pad comprises performing a second reflow process separate from the first reflow process.

16. The method of claim 7, wherein lower sidewalls of the conductive pillar are free of the metal cap layer, wherein after reshaping the conductive pillar, a lower portion of the conductive pillar proximate the first conductive pad protrudes beyond exterior sidewalls of the metal cap layer.

17. A method comprising:
forming a solder bump over a pad region of a first substrate, wherein a lower portion of the solder bump is embedded in a mask layer and an upper portion of the solder bump is exposed by the mask layer;
forming a metal cap layer over an upper surface of the solder bump and over sidewalls of the upper portion of the solder bump while sidewalls of the lower portion of the solder bump are covered by the mask layer;
removing the mask layer to expose sidewalls of the lower portion of the solder bump;
removing the metal cap layer from the upper surface of the solder bump to expose the upper surface of the solder bump;
performing a first reflow process to reshape the solder bump; and
after the first reflow process, attaching the upper surface of the solder bump to a second pad region of a second substrate.

18. The method of claim 17, wherein after the first reflow process, portions of the solder bump extend beyond lateral extents of the metal cap layer.

19. The method of claim 17, wherein the solder bump has straight sidewalls before the first reflow process, and wherein the solder bump has curved sidewalls after the first reflow process.

20. The method of claim 17, wherein the metal cap layer has a first shape before the first reflow process, and wherein the first reflow process reshapes the metal cap layer into a second shape different from the first shape.

* * * * *